US010391768B2

(12) United States Patent
Reinten et al.

(10) Patent No.: US 10,391,768 B2
(45) Date of Patent: Aug. 27, 2019

(54) PROCESS OF MANUFACTURING DROPLET JETTING DEVICES

(71) Applicant: Océ-Technologies B.V., Venlo (NL)

(72) Inventors: Hans Reinten, Venlo (NL); René J. Van der Meer, Venlo (NL); Maikel A. J. Huygens, Venlo (NL); Klaas Verzijl, Venlo (NL)

(73) Assignee: Océ-Technologies B.V. (NL)

( * ) Notice: Subject to any disclaimer, the term of this patent is extended or adjusted under 35 U.S.C. 154(b) by 0 days.

(21) Appl. No.: 15/766,139

(22) PCT Filed: Oct. 7, 2016

(86) PCT No.: PCT/EP2016/074023
§ 371 (c)(1),
(2) Date: Apr. 5, 2018

(87) PCT Pub. No.: WO2017/063950
PCT Pub. Date: Apr. 20, 2017

(65) Prior Publication Data
US 2018/0290450 A1 Oct. 11, 2018

(30) Foreign Application Priority Data
Oct. 13, 2015 (EP) .................................... 15189511

(51) Int. Cl.
*B41J 2/14* (2006.01)
*B41J 2/16* (2006.01)
*H01L 41/08* (2006.01)

(52) U.S. Cl.
CPC ........... *B41J 2/14233* (2013.01); *B41J 2/161* (2013.01); *B41J 2/1623* (2013.01); *B41J 2/1628* (2013.01);
(Continued)

(58) Field of Classification Search
CPC .... B41J 2/14233; B41J 2/1628; B41J 2/1623; B41J 2/161; B41J 2002/1437;
(Continued)

(56) References Cited

U.S. PATENT DOCUMENTS 7,314,270 B2 1/2008 Enomoto et al.
2005/0083380 A1 4/2005 Enomoto et al.
(Continued)

FOREIGN PATENT DOCUMENTS

EP 1997637 A1 12/2008

OTHER PUBLICATIONS

IP.com search (Year: 2018).*
IP.com search2 (Year: 2018).*

*Primary Examiner* — Lisa Solomon
(74) *Attorney, Agent, or Firm* — The Webb Law Firm

(57) ABSTRACT

A process of manufacturing droplet jetting devices includes bonding together a nozzle wafer defining nozzles of the jetting devices, a membrane wafer carrying, on a membrane, actuators for generating pressure waves in a liquid in pressure chambers that are connected to the nozzles, and a distribution wafer forming a distribution layer that defines supply lines for supplying the liquid to the pressure chambers from a liquid reservoir formed on a side of the distribution layer opposite to the membrane wafer; and dicing the bonded wafers. The distribution layer has a thickness larger than the thickness of each of the other two wafers. A restrictor for controlling the inertance of the liquid supply line is formed through the distribution layer in a direction normal to the plane of that layer.

14 Claims, 8 Drawing Sheets

(52) U.S. Cl.
CPC .................. *B41J 2002/1437* (2013.01); *B41J 2002/14241* (2013.01); *B41J 2002/14419* (2013.01); *H01L 41/08* (2013.01)

(58) Field of Classification Search
CPC ... B41J 2002/14419; B41J 2002/14241; H01L 41/08
See application file for complete search history.

(56) References Cited

U.S. PATENT DOCUMENTS

| | | | |
|---|---|---|---|
| 2007/0074394 | A1 | 4/2007 | Miyata et al. |
| 2009/0231397 | A1 | 9/2009 | Kuriki |
| 2013/0115724 | A1 | 5/2013 | Kearl et al. |

* cited by examiner

PROCESS OF MANUFACTURING DROPLET JETTING DEVICES

CROSS-REFERENCE TO RELATED APPLICATIONS

This application is the United States national phase of International Application No. PCT/EP2016/074023 filed Oct. 7, 2016, and claims priority to European Patent Application No. 15189511.7 filed Oct. 13, 2015, the disclosures of which are hereby incorporated in their entirety by reference.

BACKGROUND OF THE INVENTION

Field of the Invention

The invention relates to a process of manufacturing droplet jetting devices by bonding together a nozzle wafer defining nozzles of the jetting devices, a membrane wafer carrying, on a membrane, actuators for generating pressure waves in a liquid in pressure chambers that are connected to the nozzles, and a distribution wafer forming a distribution layer that defines supply lines for supplying the liquid to the pressure chambers, from a liquid reservoir formed on a side of the distribution layer opposite to the membrane wafer, and by dicing the bonded wafers. The invention further relates to a droplet jetting device obtained by such a process.

More particularly, the invention relates to manufacturing ink jet devices which are formed by Micro Electro-Mechanical Systems (MEMS).

Description of Related Art

In order to form the necessary functional components and structures of the jetting devices in an efficient process, it is common practice to apply a sequence of (photo-) lithographic steps and bonding steps on a wafer scale, thereby to obtain a wafer stack which can then be diced in order to obtain individual jetting devices or groups of jetting devices. In the lithographic steps, the necessary structures are gradually built up on the respective wafers, and the bonding steps are used to build up the wafer stack by stacking the wafers one upon the other and bonding them together. It will be understood that the lithographic steps and the bonding steps may be performed in an alternating sequence, so that some of the lithographic steps may be performed not on individual wafers but on complete or incomplete wafer stacks.

In order to perform these process steps safely and without damaging the fragile structures, it is necessary that each substrate or stack of substrates have a sufficient thickness and mechanical strength to be manipulated during the sequence of process steps. Further, the final stack of substrates needs to have sufficient mechanical strength and thus requires a certain minimum thickness.

In a conventional process, an example of which has been described in EP 1 997 637 A1, the membrane wafer is used as the substrate. The membrane wafer may for example be formed from a SOI (Silicon On Insulator) wafer which has a silicon layer with sufficient thickness to serve as a handle during the various process steps.

The distribution wafer has the purpose to form a cover that protects the actuators on the membrane wafer and/or delimits the pressure chambers. Further, the distribution wafer defines supply lines through which the liquid (e.g. ink) is supplied to the individual pressure chambers. These supply lines include so-called restrictors which are formed by passages with a carefully calibrated length and cross section and serve to appropriately adapt the inertance of the liquid flow system such that, when a pressure wave is created in the pressure chamber, a droplet of the liquid will be jetted out through the nozzles rather than only flowing back towards the supply side through the restrictor. In a known design, the distribution wafer has a relatively small thickness and the length direction of the restrictor is in parallel with the plane of the distribution wafer.

U.S. Pat. No. 7,314,270 B2 discloses a droplet jetting device wherein the distribution wafer forms a liquid reservoir connected to the pressure chambers by supply lines that extend through the bottom of the reservoir in a direction normal to the plane of the wafer.

SUMMARY OF THE INVENTION

It is an object of the invention to improve the efficiency and yield of the manufacturing process and the quality of the resulting products.

In the method according to the invention, in order to achieve this object, the distribution layer has a thickness larger than the thickness of each of the other two layers, in order for the fabricated wafer structure to have sufficient mechanical strength, and a restrictor for controlling the inertance of the liquid supply line is formed through the distribution layer in a direction normal to the plane of that layer.

The invention has the advantage that the thickness of the nozzle wafer can be reduced while the distribution wafer permits a safe handling of the fabricated wafer structure. A suitable thickness of the distribution wafer for such safe handling and/or for providing sufficient mechanical strength and rigidity of the resulting wafer stack is more than 200 micron, preferably more than 300 micron and more preferably more than 400 micron.

In a conventional device, a layer of the nozzle wafer forms so-called feedthroughs which connect the nozzles to their respective pressure chambers but have a cross-section significantly larger than that of the nozzles. According to the invention, by reducing the thickness of the nozzle wafer, it is possible to reduce the length of these feedthroughs, with the result that the flow resistance and inertance for the liquid is reduced. This permits higher droplet generation frequencies and consequently an increased productivity of the ink jet device.

Moreover, the increased thickness of the distribution wafer not only provides for the needed mechanical strength and rigidity of the wafer stack forming the print head, it also provides for a suitable length for the supply line to function as the restrictor. The supply line may be provided as a through hole in the distribution wafer. Optionally, the length of the restrictor may be designed in accordance with a desired length in view of the acoustic design (flow resistance, inertance, compliance) by providing a trench on one end or on each end of the through hole. For example, the inertance I is given by $I=\rho L/A$ and using one or two trenches allows to virtually freely select a desired combination of restrictor length L and restrictor cross-sectional area A.

Since the distribution wafer may be a single-layer wafer, e.g. a silicon wafer, it has a high heat conductivity (larger than that of a SOI nozzle wafer, for example), and thanks to its large thickness, the distribution wafer has also a relatively high heat capacity, which helps to stabilize and equalize the temperature conditions during printing.

In one embodiment, the large thickness of the distribution wafer is utilized for arranging the restrictors such that they extend normal to the plane of the wafer, i.e. in thickness direction of the distribution wafer, which permits a design with more densely arranged nozzles and, consequently, a higher resolution of the ink jet printer.

Since the nozzle wafer is no longer required to have a large thickness, it is advantageous to use a double-SOI wafer as nozzle wafer, which permits to control the length of the nozzles with high accuracy and thereby assure reproducible droplet generating properties.

BRIEF DESCRIPTION OF THE DRAWINGS

Embodiment examples will now be described in conjunction with the drawings, wherein.

DESCRIPTION OF THE INVENTION

Figure 1:
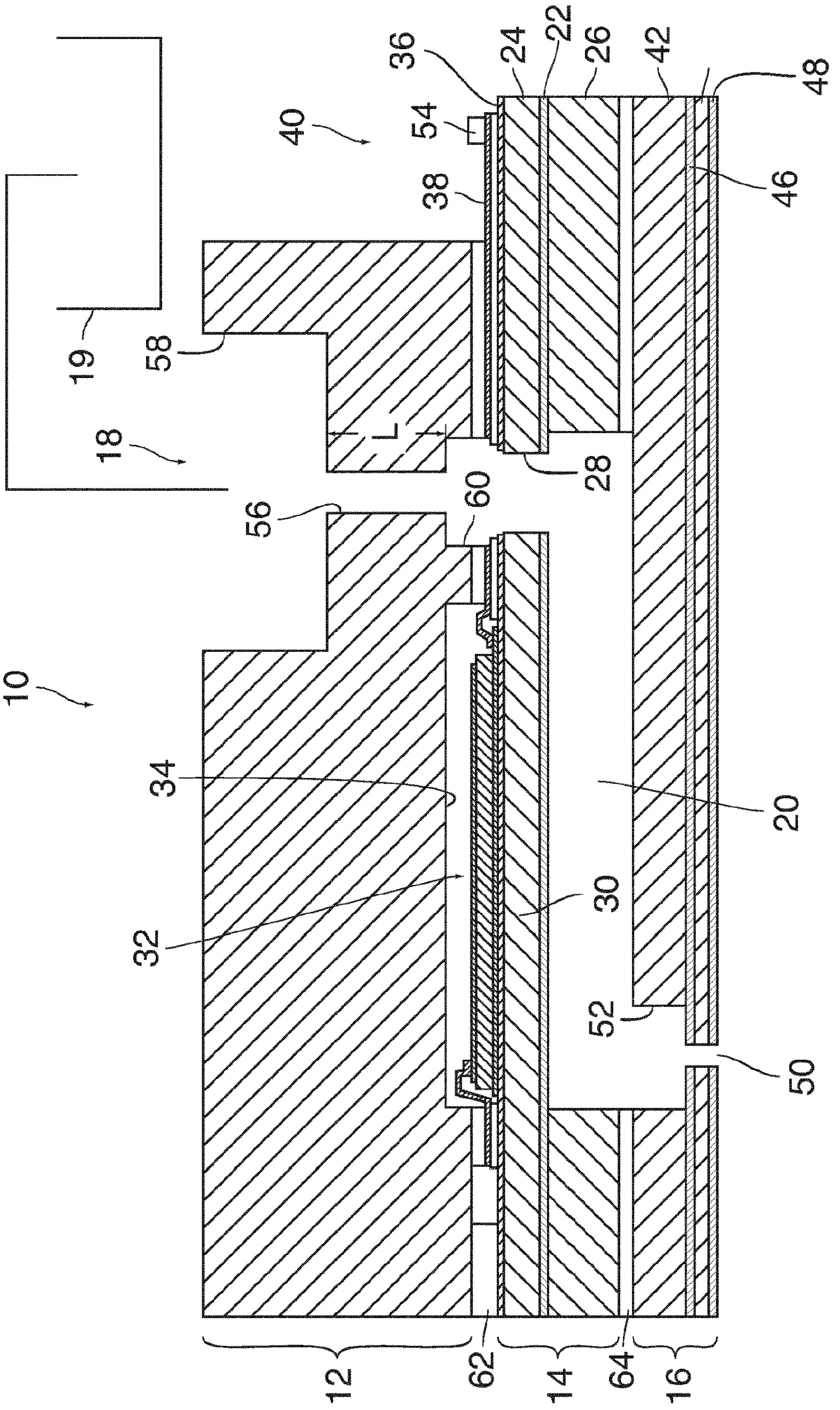
FIG. 1 is a sectional view of a droplet jetting device according to an embodiment of the invention.

FIG. 1 shows a single droplet jetting device 10 which is one of a plurality of jetting devices that have an identical design and are integrated into a common MEMS chip that may be used in an ink jet print head, for example. The MEMS chip and, accordingly, the jetting devices 10 have a layered structure comprising as main layers a distribution layer 12, a membrane layer 14 and a nozzle layer 16.

The distribution layer 12 is a single silicon layer having a relatively large thickness of at least 200 micron, preferably 300 micron and more preferably more than 400 micron. In the present example, the thickness is 400 micron. The distribution layer 12 defines an ink supply line 18 through which liquid ink may be supplied from an ink reservoir 19 to a pressure chamber 20 that is formed on the bottom side of the membrane layer 14. The ink reservoir 19 which has been shown only schematically in FIG. 1 is common to a plurality of jetting devices and is formed separately from the distribution layer 12 on the top side of the distribution layer, i.e. on the side opposite to the membrane layer 14. This has the advantage that the distribution layer 12 is not weakened by any cavity forming the reservoir.

The membrane layer 14 is obtained from a SOI wafer having an insulator layer 22 and silicon layers 24 and 26 formed on both sides thereof. In this embodiment, the final membrane layer 14 may have a thickness of about 75 micron. The pressure chamber 20 is formed in the bottom silicon layer 26. The top silicon layer 24 and the insulator layer 22 form a continuous flexible membrane 30 with uniform thickness which extends over the entire area of the MEMS chip and is pierced by an opening 28 only at the position of the ink supply line 18 so as to connect the ink supply line to the pressure chamber 20. A piezoelectric actuator 32 is formed on the top side of the part of the membrane 30 that covers the pressure chamber 20. The actuator 32 is accommodated in an actuator chamber 34 formed at the bottom side of the distribution layer 12.

An electrically insulating silicon oxide layer 36 insulates the actuator 32 and its electrodes from the silicon layer 24 and carries electric leads 38 arranged to contact the electrodes on the top and bottom sides of the actuator 32. The leads 38 are exposed and contactable in a contact region 40 where the distribution layer 12 has been removed.

The nozzle layer 16 is obtained from a double-SOI wafer and has a top silicon layer 42 and a thinner silicon layer 44 interposed between two insulator layers 46 and 48. In this embodiment, the final nozzle layer may have a thickness of about 125 micron. A nozzle 50 is formed in the two insulator layers 46 and 48 and in the silicon layer 44 intervening between them, so that the thickness of these three layers defines the length of the nozzle. The top silicon layer 42 of the nozzle layer 16 defines a feedthrough 52 which connects the pressure chamber 20 to the nozzle 50 but has a cross-section that is significantly larger than that of the nozzle 50.

It will be understood that the droplet jetting devices 10 of the MEMS chip are arranged such that their nozzles 50 define a nozzle array consisting for example of one, two or even more parallel nozzle lines with uniform nozzle-to-nozzle spacings which will determine the spatial resolution of the print head. Within the contact region 40, each of the leads 38 can be contacted, e.g. via bumps 54, so that energizing signals in the form of electric voltage pulses may be applied individually to each actuator 32. When a voltage is applied to the electrodes of the actuator 32, the piezoelectric material of the actuator is caused to deform in a bending mode, thereby flexing the membrane 30 and consequently changing the volume of the pressure chamber 20. Typically, a voltage pulse is applied to the actuator to cause a deformation that increases the volume of the pressure chamber 20, so that ink is sucked-in from the supply line 18. Then, when the voltage pulse drops off or changes into a pulse with opposite polarity, the volume of the pressure chamber 20 is decreased abruptly, so that an acoustic pressure wave is generated which propagates through the pressure chamber 20 and through the feedthrough 52 to the nozzle 50, with the result that a droplet of ink is jetted-out from the nozzle 50.

In order to obtain a stable and reproducible droplet generation and jetting behaviour, it is necessary that some critical parameters of the design of the jetting device 10 are controlled with high accuracy. This applies in particular to the length and the cross-sectional area of the nozzle 50 and to the acoustic properties and flow properties of the ink supply line 18.

When the actuator 32 performs a suction stroke, ink is sucked in from the ink supply line 18 whereas capillary forces in the nozzle 50 prevent ambient air from entering through the nozzle. Then, during the subsequent compression stroke of the actuator 32, the acoustic pressure that causes the ink to be jetted out from the nozzle 50 has to overcome the capillary forces in the nozzle as well as the frictional forces that are produced in the nozzle 50 and in the feedthrough 52 due to a certain viscosity of the liquid ink. The ink supply line 18 must be designed such that, in spite of these resistances, a significant part of the ink is forced out as a droplet through the nozzle 50 rather than being only pushed back into the ink supply line 18. To that end, the ink supply line 18 is designed to have a certain inertance, so that the inertia of the liquid that flows-in during the suction stroke will compensate the forces that tend to urge the liquid back in opposite direction during the compression stroke.

In order to control the inertance of the ink supply line 18, this supply line forms a restrictor 56, i.e. a liquid flow passage with a certain length L and a certain cross-sectional area A. If p is the density of the liquid ink, then the inertance I is given by:

$$I=\rho L/A.$$

Consequently, the inertance could theoretically be made as large as desired by reducing the cross-sectional area A. This, however, would also increase the frictional flow resistance due to the viscosity of the ink, so that, in practise, the cross-sectional area A cannot be reduced below a certain limit. Consequently, the restrictor 56 must necessarily have a certain length L.

In the design that is proposed here, the relatively large thickness of the distribution layer 12 is utilized for arranging the restrictor 56 to extend vertically through the distribution layer 12. That is, the longitudinal axis of the restrictor 56 is normal to the plane of the layers 12, 14 and 16 of the device. This permits a compact design with small dimensions of the jetting device 10 in the plane of the layers 12-16. This has the advantage that a larger number of MEMS chips can be produced from a single wafer having a given diameter. Further, the compact design permits a close packing of the individual devices 10 within the chip, and therewith a high nozzle density and, consequently, a high spatial resolution of the print head. Another advantage of the vertical arrangement of the restrictor 56 is that the length and cross-sectional area of the restrictor can be controlled with high precision by using well-established lithographic techniques.

In the example shown, the restrictor 56 extends between a trench 58 and a restrictor cavity 60, forming an end part of the ink supply line 18, that have been formed in the top surface and the bottom surface, respectively, of the distribution layer 12. This permits to select the length L of the restrictor 56 independently from the total thickness of the distribution layer 12. Nevertheless, the length L of the restrictor can be controlled with high precision because the total thickness of the distribution layer 12 is known or can be measured with high accuracy, and the respective depths of the trench 58 and the restrictor cavity 60 can be determined precisely by controlling the etch times when the trench and/or restrictor cavity are formed by etching.

As has been shown in FIG. 1, the distribution layer 12 is connected to the membrane layer 14 by a bonding layer 62. Similarly, the membrane layer 14 is connected to the nozzle layer 16 by a bonding layer 64. The bonding layers 62 and 64 being layers of adhesive, their physical properties are difficult to control. However, in the design that has been proposed here, the bonding layers are arranged such that their properties do not significantly affect any of the critical parameters of the design.

In particular, when a part of the adhesive forming the bonding layer 62 is squeezed out into the restrictor cavity 60, this may affect the width of this restrictor cavity 60, but the reduction in width will be negligible in comparison to the total width of the restrictor cavity 60. Most importantly, the adhesive of the bonding layer 62 will in no way affect the critical cross-sectional area A nor the length L of the restrictor 56, so that the inertance can be controlled with high precision.

Similarly, any adhesive that may be squeezed out from the bonding layer 64 into the feedthrough 52 will only affect the (less critical) width of the feedthrough but not the cross-sectional area of the nozzle 50.

As above mentioned, the distribution layer 12 may be 400 microns, while the membrane layer 14 and the nozzle layer 16 together may be only 200 microns thick. Hence, the mechanical strength and rigidity to enable to handle the fabricated wafer stack results from the thickness of the distribution layer 12. Note that the rigidity and mechanical strength are also needed for efficient droplet forming upon bending of the actuator 32. Without sufficient rigidity, the actuator 32 would bend not only the membrane 30, but potentially the whole stack would be deformed, resulting in a significant loss of bending energy and a corresponding deterioration of the actuation efficiency. Further, as the distribution layer provides for mechanical strength and rigidity, the membrane layer and the nozzle layer may have any desirable thickness, thereby providing more freedom of design, potentially resulting in a more efficient fluidic/acoustic design of the print head. Efficiency, in this case, may relate to energy efficiency or cost efficiency or efficiency of dimensions, or any other property that may be optimized.

A process of manufacturing a large number of MEMS chips each of which includes a plurality of droplet jetting devices 10 will now be described in conjunction with FIGS. 2 to 15.

Figure 2:
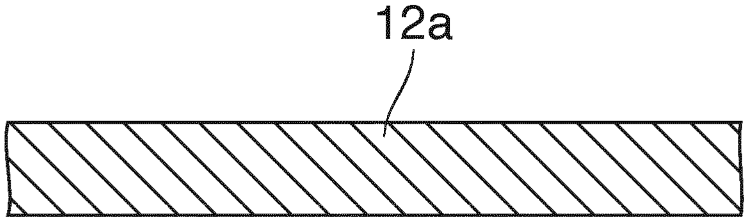
FIGS. 2 to 4 illustrate steps of processing a distribution wafer in the device shown in FIG. 1.

FIG. 2 shows a cross-section of a part a distribution wafer **12*a* which is to form the distribution layers 12 of the jetting devices. In the example shown, the distribution wafer 12*a*** is a DSP (Double Side Polished) silicon wafer with a total thickness of 400 μm.

Figure 3:
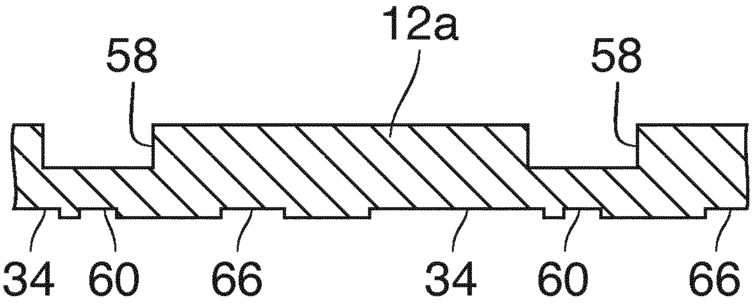

Using known photolithographic techniques of masking and etching, the trenches 58 are formed in the top surface of the distribution wafer **12*a*, and the restrictor cavities 60 and the actuator chambers 34 are formed in the bottom surface, as has been shown in FIG. 3. Further, contact chambers 66 which will be used for forming the contact areas 40 in FIG. 1** are formed in the bottom surface of the wafer.

In the simple example that is being presented here, each MEMS chip consists only of a single row of jetting devices 10 (the row extending in the plane normal to the drawings), and FIGS. 3 to 15 show the structures for two adjacent jetting devices that will eventually belong to two different MEMS chips.

Figure 4:
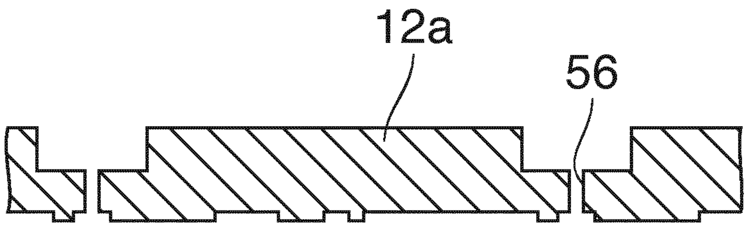

Then, as is shown in FIG. 4, an etch process such as DRIE (Deep Reactive Ion Etching) is used for forming the restrictors 56.

Figure 5:
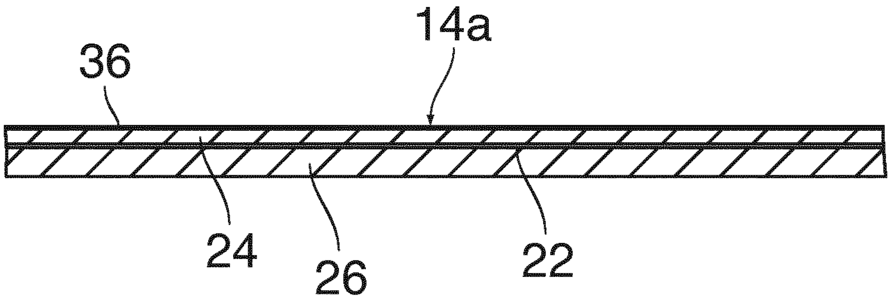
FIGS. 5 to 7 illustrate steps of processing a membrane wafer of the device.
Figure 6:
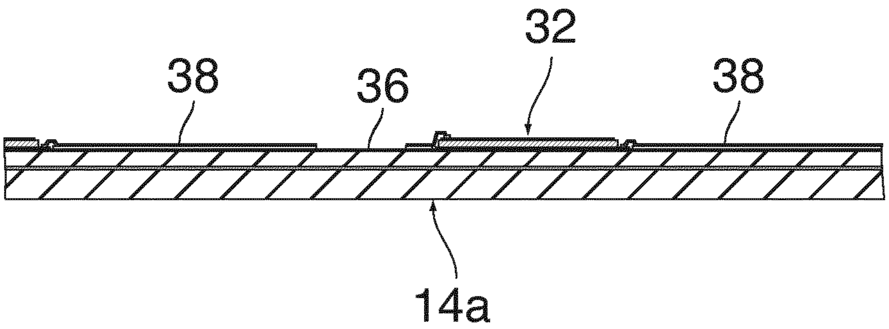
Figure 7:
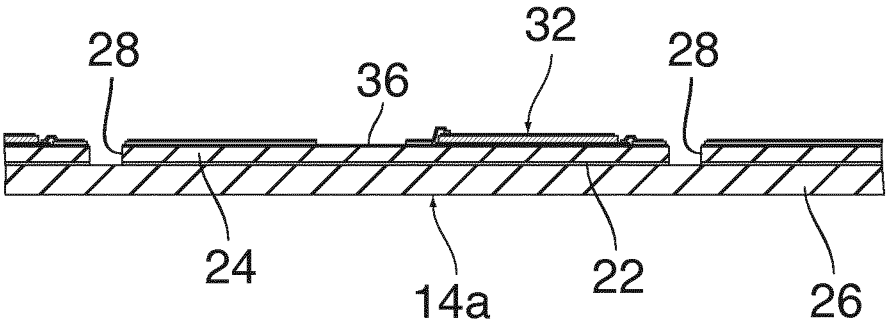

FIGS. 5 to 7 show steps of processing a membrane wafer **14*a* which is to form the membrane layers 14 of the jetting devices 10**.

As is shown in FIG. 5, the process starts with providing a SOI wafer having the silicon layers 24 and 26 and the insulator layer 22 sandwiched therebetween. The oxide layer 36 is formed on the top surface of the silicon layer 24.

Then, as is shown in FIG. 6, the various layers of the actuators 32 and the leads 38 are built up step-wise on the top surface of the oxide layer 36.

FIG. 7 illustrates a step in which the openings 28 are formed in the membrane 30 by etching between the layer or layers forming the leads 38 and through the oxide layer 36 and the first two layers of the SOI wafer. Again, a well-known and suitable etch process, such as DRIE for etching silicon, may by employed. The etch process may be continued into the bottom layer 26 of the SOI wafer where the pressure chamber 20 is to be formed in a later step, so that the depth of the etch process forming the openings 28 is not critical. In particular and as known by those skilled in the art, etching of $SiO_2$ is selective to Si etching, so no significant over-etching in silicon is to be expected.

Figure 8:
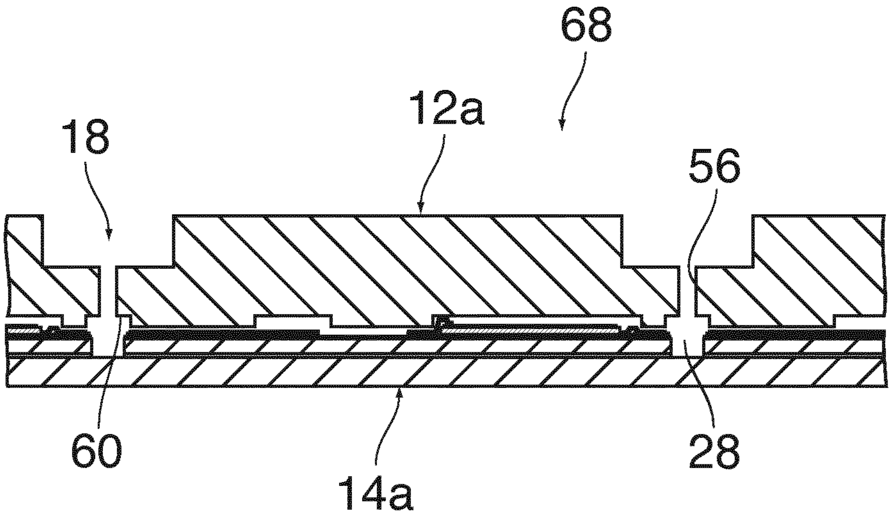
FIG. 8 illustrates a step of bonding together the distribution wafer and the membrane wafer.

Then, the distribution wafer 12*a* in the condition shown in FIG. 4 and the membrane wafer 14*a* in the condition shown in FIG. 7 are bonded together in a first bonding step, as has been illustrated in FIG. 8. In this bonding step, the wafers 12*a* and 14*a* are adjusted so as to align the restrictors 56 with the openings 28. The alignment step is facilitated because the relatively wide restrictor cavity 60 assures that minor alignment errors will have no adverse effect on the properties of the liquid supply line 18.

The bonding step shown in FIG. 8 results in a semi-completed wafer stack 68 comprising the distribution wafer 12*a* and the membrane wafer 14*a*. The large thickness of the distribution wafer 12*a* permits to use this distribution wafer as a handle for manipulating the entire wafer stack 68 in the subsequent process steps. Note that in practice, the membrane wafer 14*a* as illustrated in FIGS. 5-7 may be provided with an additional handle layer or the silicon layer 26 may have a significant larger thickness for handling during processing. After bonding to the distribution wafer 12*a*, such a handle layer may be removed or the thickness of the silicon layer 26 may be reduced by suitable back grinding.

Figure 9:
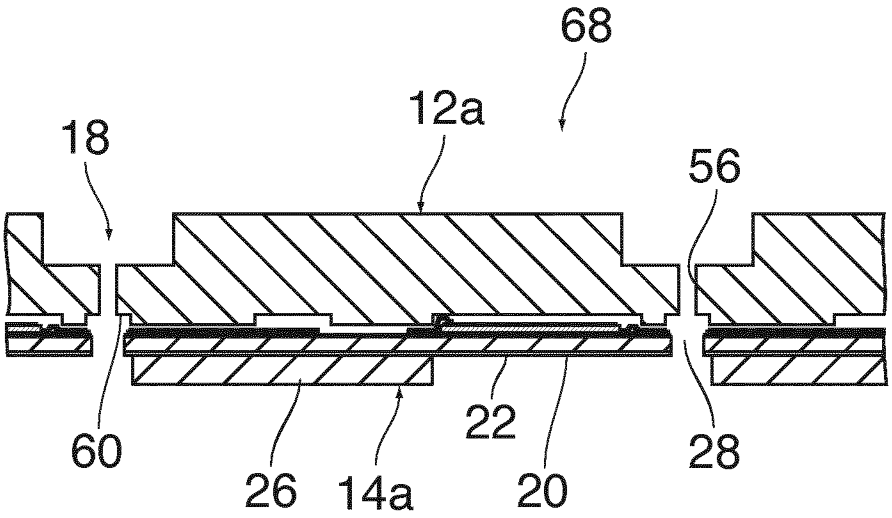
FIG. 9 illustrates a step of further processing of the wafer stack formed by the distribution wafer and the membrane wafer.

As is shown in FIG. 9, the distribution wafer 12*a* is used as a substrate holding the membrane wafer 14*a* while the bottom surface of the membrane wafer is subject to an etch process for etching the pressure chambers 20 into the silicon layer 26, until a fluid connection between each pressure chamber 20 and the corresponding restrictor 56 has been established. In the parts of the pressure chamber 20 outside of the opening 28, the insulator layer 22 serves as an etch stop.

Figure 10:
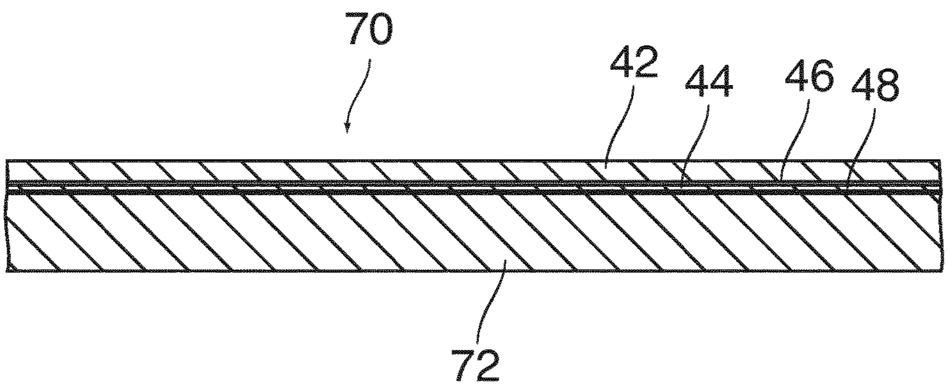
FIGS. 10 and 11 illustrate a step of processing a nozzle wafer of the device.

FIG. 10 shows a double-SOI wafer 70 which serves for forming the nozzle layers 16 of the jetting devices 10. In the condition shown in FIG. 10, the double-SOI wafer 70 has the silicon layers 42 and 44 and the insulator layers 46 and 48 which have already been discussed in conjunction with FIG. 1, as well as another silicon layer 72 on the bottom side of the insulator layer 48.

Figure 11:
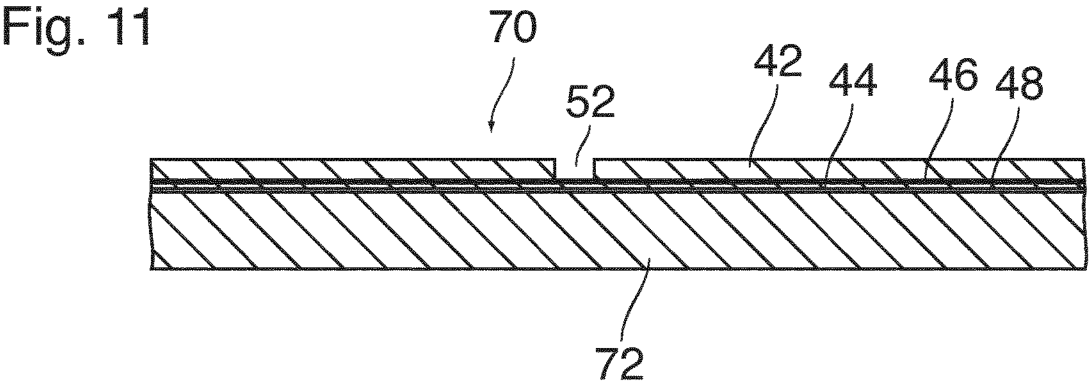

As is shown in FIG. 11, the top silicon layer 42 is subject to an etch process in which the feedthrough 52 is formed. In this process, the top insulator layer 46 serves as an etch stop. Among the various layers of the double-SOI wafer 70, the bottom silicon layer 72 has the largest thickness. This layer may therefore serve as a handle for manipulating the wafer while the etch process in FIG. 11 is performed. However, the overall thickness of the double-SOI wafer 70 is still smaller than the overall thickness of the distribution wafer 12*a*. In particular, the top silicon layer 52 of the wafer has only a relatively small thickness of 70 μm, for example, which results in a correspondingly small length and flow resistance of the feedthrough 52.

Figure 12:
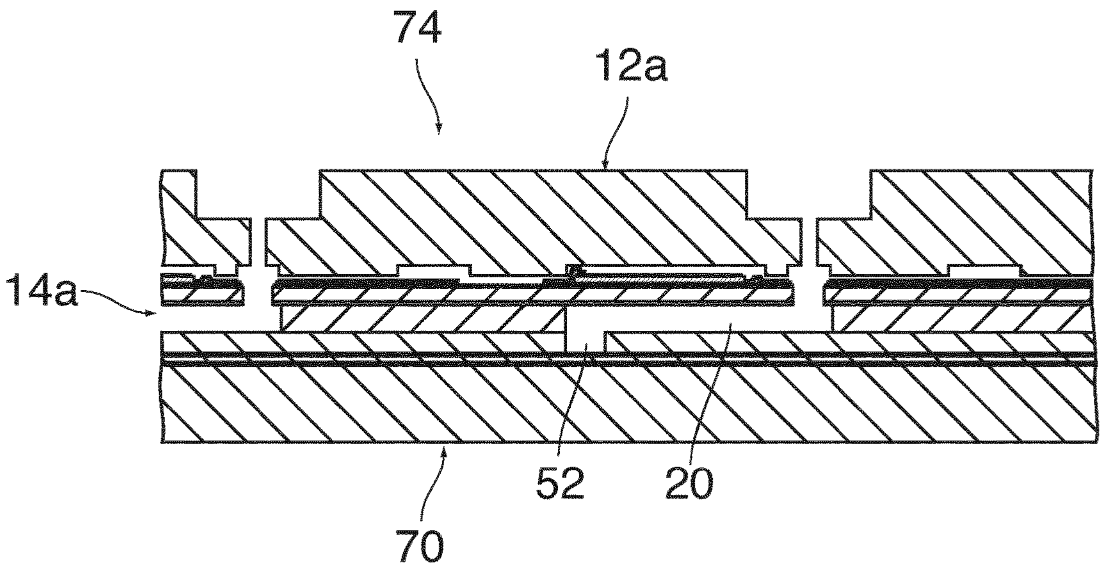
FIG. 12 shows a wafer stack formed by bonding the nozzle wafer to the membrane wafer of the stack shown in FIG. 9.

FIG. 12 illustrates a second bonding step in which the distribution wafer 12*a* is used as a substrate for bonding the double-SOI wafer 70 in the condition shown in FIG. 11 to the surface (bottom surface in FIG. 12) of the membrane wafer 14*a*, thereby to obtain a complete wafer stack 74 composed of the distribution wafer 12*a*, the membrane wafer 14*a* and the double SOI wafer 70. In this second bonding step, the double-SOI wafer 70 is adjusted to align the feedthrough 52 with the pressure chamber 20. Again, the relatively large width of the feedthrough 52 facilitates the alignment process because it allows for certain alignment tolerances without significantly changing the flow properties and acoustic properties of the liquid flow system.

Figure 13:
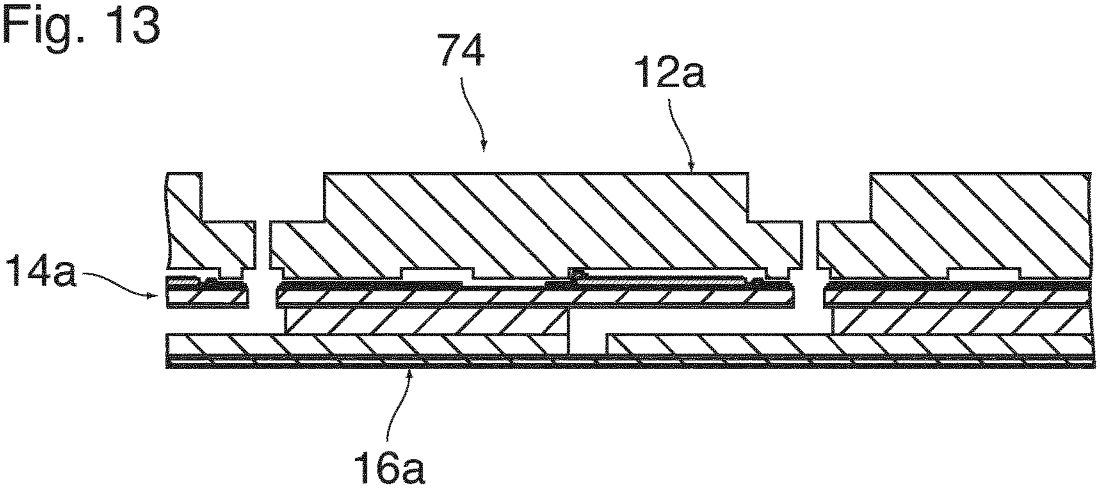
FIGS. 13 and 14 illustrate final process steps performed on the wafer stack.

Then, while the wafer stack 74 is supported and held at the distribution wafer 12*a*, the bottom silicon layer 72 of the double SOI wafer 70 is grinded or etched away, which transforms the double-SOI wafer into a nozzle wafer 16*a*, as shown in FIG. 13, thereby defining the eventual print head chip thickness.

Since the double-SOI wafer 70 was not required to serve as a substrate for building up the wafer stack 74, the silicon layer 72 is allowed to have a relatively small thickness, which increases the efficiency of the etching or grinding process required for obtaining the wafer stack 74 in the condition shown in FIG. 13.

Figure 14:
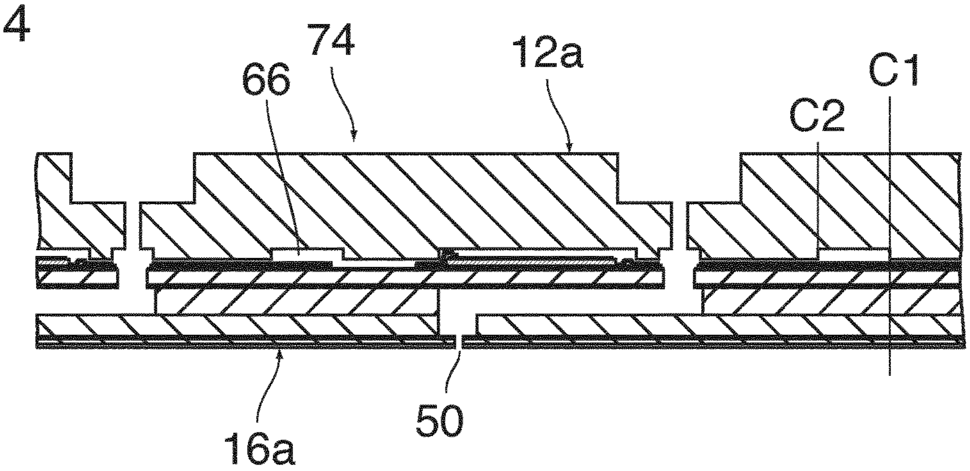

Then, as is shown in FIG. 14, the distribution wafer 12*a* is once again used as a handle or substrate for performing another etching step on the nozzle wafer 16*a* in order to form the nozzles 50 by etching through the two insulator layers and the intervening silicon layer of the former double-SOI wafer. In this process, no precise control of the etch time is required because the length of the nozzle 50 is determined by the thickness of the corresponding layers of the double-SOI wafer.

Figure 15:
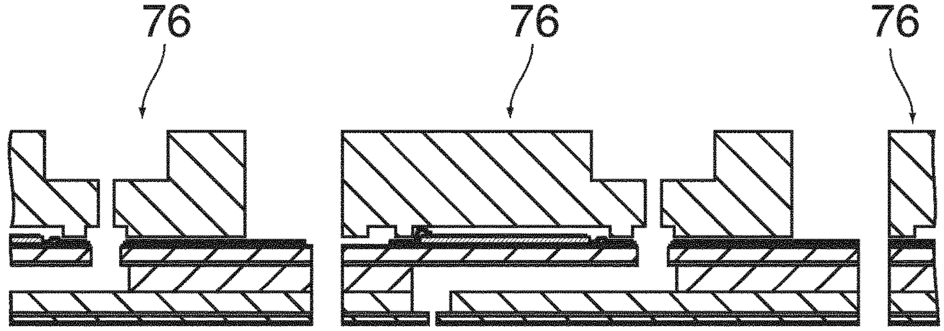
FIG. 15 illustrates a step of dicing the wafer stack in order to obtain several units of droplet jetting devices.

In a final dicing step, shown in FIG. 15, the wafer stack 74 is divided into a number of MEMS chips 76 each of which comprises a row of droplet jetting devices 10. As is shown in FIG. 14, a main dicing cut C1 is performed through all three wafers of the stack at the position of one end of the contact chamber 66, and an auxiliary dicing cut C2 is performed only through the distribution wafer 12*a* at the position of the opposite end of the contact chamber 66, thereby to form the contact region 40 (FIG. 1) for electrically contacting the actuators.

Figure 16:
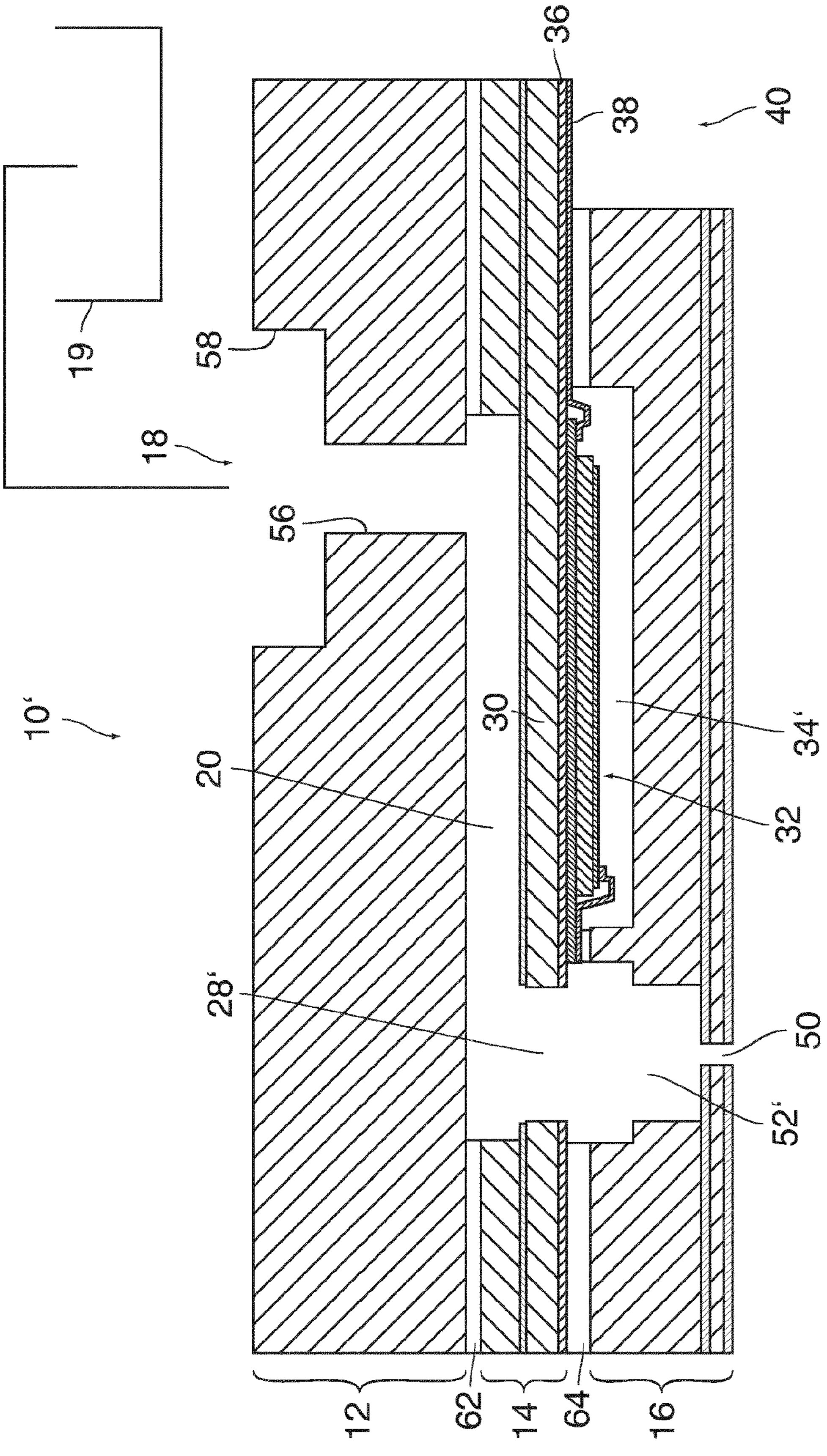
FIG. 16 is a sectional view of a droplet jetting device according to another embodiment.

FIG. 16 shows a droplet jetting device 10' according to another embodiment of the invention. The main components of the jetting device 10' are the same as those of the jetting device 10 shown in FIG. 1. Consequently, components which have the same function and the same general design are designated by the same reference numerals as in FIG. 1.

The main difference between the device 10' shown in FIG. 16 and the device 10 shown in FIG. 1 is that the membrane layer 14 has been bonded to the nozzle layer 16, with the actuator 32 facing downwards. Consequently, the actuator is accommodated in an actuator chamber 34' that is formed in the top silicon layer of the nozzle layer 16. Like in the embodiment of FIG. 1, the membrane layer 14 is obtained from a SOI wafer but the wafer has been flipped such that the oxide layer 36 is now arranged facing and bonded to the nozzle layer 16, whereas the pressure chamber 20 is formed in the silicon layer on a top side of the membrane layer 14.

The distribution layer 12 has a trench 58 and a restrictor 56, but the restrictor 56 is directly connected to the pressure chamber 20 in a position slightly offset from the end of the pressure chamber 20, so that the bonding layer 62 does not influence the width of the restrictor. The restrictor cavity 60 (FIG. 1) at the bottom end of the restrictor 56 has been dispensed with in this example.

The membrane layer 14 forms an opening 28' for connecting an outlet end of the pressure chamber 20 to a stepped feedthrough 52' that has been formed in the same silicon layer of the nozzle layer 16 as the actuator chamber 34'.

Since the leads for electrically connecting the actuator 32 are now formed on the bottom side of the membrane layer 14, the contact region 40 is also formed on the bottom side of the device by removing a part of the nozzle layer 16.

The nozzle layer 16 may again be obtained from a double SOI wafer, having a similar or same thickness as in the embodiment of FIG. 1 as described above, in which the feedthrough 52' and the actuator chamber 34' are formed.

The fact that the length of the feedthrough 52' is larger than in FIG. 1 is partly compensated by the stepped configuration of the feedthrough, with the top part having a larger width. This facilitates the alignment of the nozzle layer 16 relative to the opening 28' in the membrane layer 14.

Figure 17:
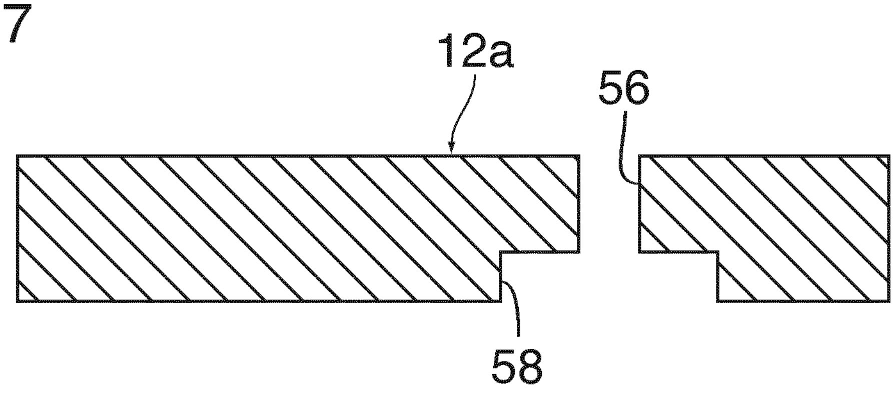
FIGS. 17 to 19 show manufacturing steps for the device shown in FIG. 16.
Figure 18:
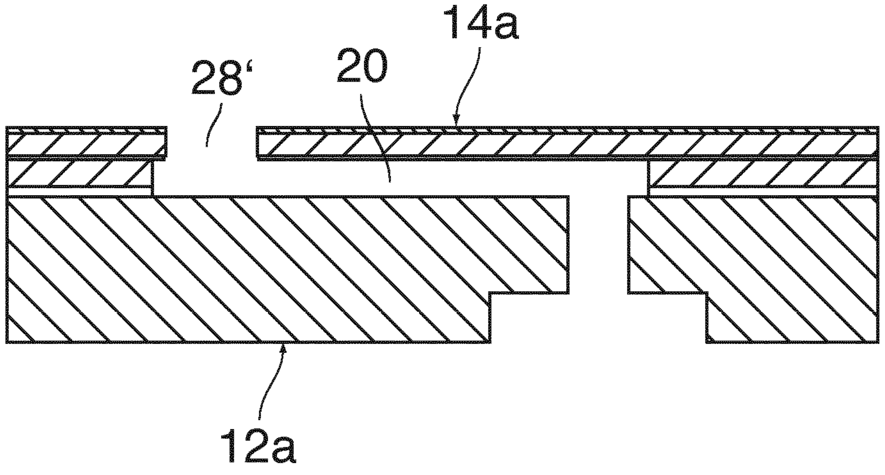
Figure 19:
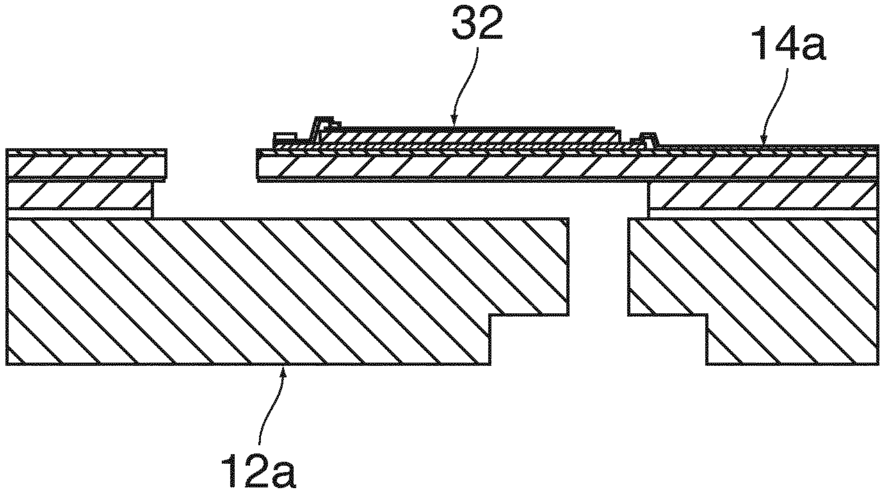

The general steps of a production process for manufacturing the devices 10' on a wafer scale have been illustrated in FIGS. 17 to 19.

As is shown in FIG. 17, the distribution wafer 12*a* is used as a substrate on which all the other components of the wafer stack are gradually built up. The trench 58 and the restrictor 56 are formed by etching. Note that, in FIGS. 17 to 19, the top-down direction has been reversed in comparison to FIG. 16.

In FIG. 18, the membrane wafer 14*a* is bonded to the distribution wafer 12*a*. The pressure chamber 20 and the opening 28' have already be formed in the membrane wafer, but this wafer does not yet carry the actuator 32, which is successively built up on the top surface of the membrane wafer 14*a* after it has been bonded to the distribution wafer 12*a*, as has been shown in FIG. 19. In another embodiment, the actuator 32 may have been provided on the membrane wafer 14*a* before it is bonded to the distribution wafer 12*a*.

In this embodiment, the photolithographic steps for forming the actuators 32 may benefit from the high heat capacity and good thermal conductivity of the distribution wafer 12*a*.

In a final step, which has not been shown in the drawings, the wafer stack is completed by bonding a nozzle wafer (forming the nozzle layer 16 in FIG. 16) to the membrane wafer 14*a*. Again, the nozzle 50 may be formed by a final etching step, wherein the distribution wafer 12*a* is used as a handle for manipulating the wafer stack.

Despite the advantages of using the relatively thick distribution wafer as a substrate during processing in accordance with the method according to the present invention, a print head according to the present invention may as well be manufactured differently. For example, first a membrane wafer may be prepared, using a membrane handle layer as above mentioned. Then a nozzle wafer may be prepared having a nozzle handle layer. The nozzle wafer and the membrane wafer may be bonded and the membrane handle layer may be removed by back grinding or etching, as known in the art. Then, the distribution wafer may be bonded to the stack of the nozzle wafer and the membrane wafer after which the nozzle handle layer may be removed, leaving the thick distribution layer as the substrate layer providing for mechanical strength and rigidity.

The invention claimed is:

1. A process of manufacturing droplet jetting devices comprising:

bonding together a nozzle wafer defining nozzles of the jetting devices, a membrane wafer carrying, on a membrane, actuators for generating pressure waves in a liquid in pressure chambers that are connected to the nozzles, and a distribution wafer forming a distribution layer that defines supply lines for supplying the liquid to the pressure chambers from a liquid reservoir formed on a side of the distribution layer opposite to the membrane wafer; and dicing the bonded wafers, wherein the distribution layer has a thickness larger than a thickness of each of the membrane wafer and the nozzle wafer, and a restrictor for controlling an inertance of the supply lines is formed through the distribution layer in a direction normal to the plane of the distribution layer.

2. The process according to claim 1, wherein the distribution wafer is used as a substrate on which a wafer stack comprising the membrane wafer and the nozzle wafer is built.

3. The process according to claim 2, further comprising:

forming a restrictor cavity in a surface of the distribution wafer that is to be bonded to the membrane wafer; and forming the restrictor so as to open out into a bottom of the restrictor cavity.

4. The process according to claim 2, comprising the steps of:

forming a trench a surface of the distribution wafer on a side opposite to a side to which the membrane wafer is to be bonded; and forming the restrictor so as to extend from a bottom of the trenches.

5. The process according to claim 3, wherein a length of the restrictor is controlled by providing the distribution wafer with a known thickness and etching the restrictor cavity into the distribution wafer and controlling an etch time so as to determine a depth of the restrictor cavity.

6. The process according to claim 1, wherein actuators are formed on a side of the membrane wafer that is to be bonded to the distribution wafer.

7. The process according to claim 1, wherein a double-SOI wafer is used for forming the nozzle wafer, and the nozzles are formed by etching through two insulator layers of the double-SOI wafer and through a silicon layer intervening therebetween, wherein the length of the nozzles is determined by a thicknesses and a spacing of the two insulator layers.

8. A droplet jetting device comprising:

a nozzle layer defining a nozzle;

a membrane layer carrying, on a membrane, an actuator for generating pressure waves in a liquid in a pressure chamber that is connected to the nozzle, and a distribution layer defining a supply line for supplying the liquid to the pressure chamber, from a liquid reservoir formed on a side of the distribution layer opposite to the membrane wafer, wherein the distribution layer and the nozzle layer are bonded to opposite sides of the membrane layer, wherein the distribution layer has a thickness larger than a thickness of each of the membrane layer and the nozzle layer, the thickness of the distribution layer is at least 200 μm, and the supply line includes a restrictor having a predetermined length and a predetermined cross-sectional area for defining a predetermined inertance, the restrictor distribution layer in a thickness direction of the distribution layer.

9. The droplet jetting device according to claim 8, wherein the thickness of the distribution layer is larger than the thickness of the membrane layer and the nozzle layer combined.

10. The droplet jetting device according to claim 9, wherein the nozzle layer has a thickness of less than 100 micron, the membrane layer has a thickness of less than 150 micron and the distribution layer has a thickness of 300 micron or more.

11. The jetting device according to claim 8, wherein the restrictor opens out into a bottom of a restrictor cavity formed in a surface of the distribution layer to which the membrane layer is bonded, a width of the restrictor cavity being larger than a width of the restrictor.

12. The jetting device according to claim 8, wherein the restrictor extends from a bottom of a trench that is formed in the distribution layer on a side opposite to a side to which the membrane layer is bonded.

13. The jetting device according to claim 8, wherein the nozzle passes through two insulator layers and intervening silicon layer of a double-SOI wafer such that a length of the nozzle is determined by the thicknesses of the two insulator layers and the silicon layer.

14. The process according to claim 4, wherein a length of the restrictor is controlled by providing the distribution wafer with a known thickness and etching the trench into the distribution wafer and controlling an etch time so as to determine a depth of the trench.

* * * * *